(12) United States Patent
Yang et al.

(10) Patent No.: US 8,767,438 B2
(45) Date of Patent: Jul. 1, 2014

(54) MEMELECTRONIC DEVICE

(75) Inventors: Jianhua Yang, Palo Alto, CA (US);
Byungjoon Choi, Mountain View, CA (US); Minxian Max Zhang, Mountain View, CA (US); Gilberto Medeiros Ribeiro, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 113 days.

(21) Appl. No.: 13/424,034

(22) Filed: Mar. 19, 2012

(65) Prior Publication Data
US 2013/0242637 A1    Sep. 19, 2013

(51) Int. Cl.
| | |
|---|---|
| *G11C 13/00* | (2006.01) |
| *G11C 7/00* | (2006.01) |
| *H01L 45/00* | (2006.01) |
| *H01L 47/00* | (2006.01) |
| *H01L 27/24* | (2006.01) |
| *H01L 21/8239* | (2006.01) |

(52) U.S. Cl.
CPC ........ *G11C 13/0002* (2013.01); *G11C 13/0004* (2013.01); *G11C 13/0007* (2013.01); *G11C 13/0069* (2013.01); *H01L 45/145* (2013.01); *H01L 45/146* (2013.01); *H01L 27/2463* (2013.01)

USPC .............. 365/148; 365/163; 365/71; 365/159

(58) Field of Classification Search
CPC .......... G11C 13/0069; G11C 13/0002; G11C 13/0004; G11C 13/0007; H01L 45/146; H01L 27/2463; H01L 45/145; H01L 45/00; H01L 47/00; H01L 27/24; H01L 21/8239; H01L 13/00
USPC .................................... 365/71, 148, 159, 163
See application file for complete search history.

(56) References Cited

U.S. PATENT DOCUMENTS

| | | | |
|---|---|---|---|
| 2011/0186801 A1* | 8/2011 | Yang et al. .................... | 257/4 |
| 2012/0014175 A1* | 1/2012 | Wang et al. ................... | 365/158 |
| 2012/0091421 A1* | 4/2012 | Wen et al. ..................... | 257/4 |
| 2012/0176831 A1* | 7/2012 | Xiao et al. .................... | 365/148 |
| 2012/0230085 A1* | 9/2012 | Kawai et al. .................. | 365/148 |
| 2012/0314477 A1* | 12/2012 | Siau .............................. | 365/148 |
| 2013/0043452 A1* | 2/2013 | Meyer et al. .................. | 257/4 |

* cited by examiner

*Primary Examiner* — Ly D Pham (57) ABSTRACT

A memelectronic device may have a first and a second electrode spaced apart by a plurality of materials. A first material may have a memory characteristic exhibited by the first material maintaining a magnitude of an electrically controlled physical property after discontinuing an electrical stimulus on the first material. A second material may have an auxiliary characteristic.

20 Claims, 5 Drawing Sheets

600

┌─ 601: Apply a first signal with a positive voltage to a first electrode of a circuit device where the circuit device has a second electrode spaced apart from the first electrode by a non-linear resistance material in series with a memristance material ┌─ 602: Apply a second signal with a negative voltage to the second electrode where the first and second signals collectively have a current sufficient to lower a first resistance of the non-linear resistance material and to change a second resistance of the memristance material in a first direction

MEMELECTRONIC DEVICE

BACKGROUND

Memelectronic devices, including memristors, memcapacitors and meminductors, are electrical devices that normally work at the nanometer scale. A memelectronic device often exhibits an ability to change its device state, such as resistance, capacitance or inductance, as electrical voltage or current is applied to it. However, once the voltage or current is discontinued, the material maintains or "remembers" the device state change. When a voltage or current is reapplied to the material, the device state may change further from state in which it has been to that point.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

The present specification describes memelectronic device principles including, for example, a memelectronic device with a first and a second electrode that are spaced apart by a plurality of materials interposed between the electrodes. Examples of such a memelectronic device may include a device with a first material having a memory characteristic such that the first material maintains a magnitude of an electrically controlled physical property even after an electrical stimulus on the first material is discontinued. The second material may have similar or different characteristics. The first and second materials may be different material types. For example, one material may be an oxide, and the other material may be a nitride. The memelectronic device may utilize advantages and properties of both material types.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1A:
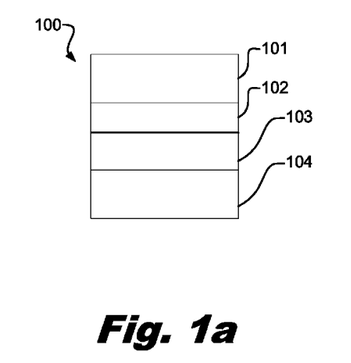
FIG. 1a is a diagram of an illustrative memelectronic device, according to principles described herein.

FIG. 1a is a diagram of an illustrative memelectronic device (100), according to principles described herein. In this example, the memelectronic device (100) has a first electrode (101) and a second electrode (104). A first material (102) between the electrodes (101, 104) has a memory characteristic such that the first material (102) maintains a magnitude of an electrically controlled physical property after an electrical stimulus on the first material (102) has been discontinued. The electric stimulus may be a current or a voltage excitation signal. The memory characteristic may be memristance, memcapacitance, meminductance, memimpedance, memadmittance, or combinations thereof.

The second material (103) is a different material than the first material (102) and has an auxiliary characteristic. The auxiliary characteristic affects an electrical property of said memelectronic device such as resistance, capacitance, inductance, other electrical property, or combinations thereof. The auxiliary characteristic may be a non-linear resistance characteristic, a current limiting characteristic, a thermal characteristic, a negative differential resistance characteristic, some other characteristic that modifies the performance of the memelectronic device, or combinations thereof.

In some examples, the second material (103) is a material with a current limiting characteristic. For example, the second material (103) may have a high resistance at voltages lower than the switching voltages of the first material (102). The switching voltages for the first material (102) are the range of voltages that cause the first material (102) to change its state.

In some examples, the second material (103) has a thermal characteristic. For example, the second material (103) has a high thermal conductivity. Such a characteristic may reduce the temperature in the memelectronic device by reducing the Joule heating caused as a current passes through the memelectronic device. In some examples, the memelectronic device may be sensitive to high temperatures. In such examples, a reduction in joule heating may prevent damage to, or improve the performance of, the memelectronic device.

As noted above, in some examples, the two materials are different types of materials. For example, the first material may be an oxide, while the second material is a nitride, sulfide, carbide, phosphide, other material type, or combinations thereof. In some examples, the first material may be a nitride, while the second material is a nitride, sulfide, carbide, phosphide, other material type, or combinations thereof. Any combination of oxides, nitrides, sulfides, carbides, phosphides, other material type, or combinations thereof may be used.

Figure 1B:
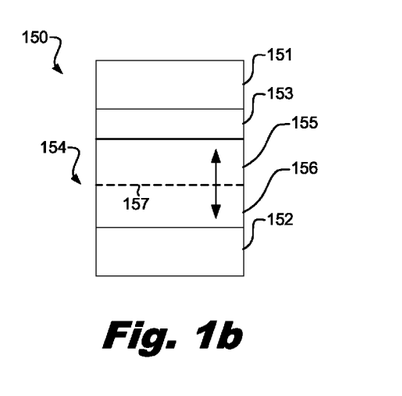
FIG. 1b is a diagram of an illustrative memelectronic device, according to principles described herein.

FIG. 1b is a diagram of an illustrative memelectronic device (150), according to principles described herein. In this example, the memelectronic device (150) has a first electrode (151), a second electrode (152) and a first material (154) and a second material (153) between the electrodes (151, 152). In this example, the memelectronic device (150) is a two terminal device. However, in other examples, the memelectronic device has three or more terminals.

The first and second electrodes (151, 152) may be made of any electrically conductive material. A non-exhaustive list of electrode materials that may be used include aluminum, tungsten, platinum, copper, titanium, brass, silver, gold, palladium, zirconium, niobium, tantalum, other metals, oxides thereof, and combinations thereof.

The second material (153) may have a non-linear resistance characteristic. Such a characteristic may be exhibited by a non-linear relationship between voltage and current as a signal is applied to the second material (153). In some examples, the non-linear resistance characteristic is a negative differential resistance (NDR) characteristic where the material exhibits a discontinuous resistance change at either a threshold current or a threshold voltage. In other examples, the non-linear resistance characteristic is exponential.

The second material (153) may include niobium, titanium, tungsten, manganese, iron, vanadium, indium, silicon, tantalum, hafnium, nickel, aluminum, zirconium, molybdenum, copper, chromium, oxides thereof, nitrides thereof, carbides thereof, phosphides thereof, sulfides thereof, doped alloys thereof, single element metals, semiconductors, and combinations thereof.

As described above, the first material (154) may have a memory characteristic. Such a memory characteristic may be exhibited by the first material maintaining a magnitude of an electrically controlled physical property after an electrical stimulus on the first material is discontinued. The electrically controlled physical property may be electrical resistance, capacitance, inductance, impedance, admittance, or combinations thereof. In some examples, the memory characteristic is a memristance characteristic, a memcapacitance characteristic, a meminductance characteristic, a memimpedance characteristic, a memadmittance characteristic, or combinations thereof. In some examples, the electrical stimulus includes controlling the physical property with an electric current, an electric charge, a voltage, a magnetic flux, or combinations thereof.

In examples where the first material (154) is a memristance material, the first material has an ability to change its resistance as electrical current is passed through it and maintain the new resistance state after the current is discontinued. For example, a first portion (155) of the memristance material may have a conductive material, like oxygen deficient $TiO_{2-x}$, and a second portion (156) may have an electrical insulator material, like $TiO_2$. A boundary (157) between the oxygen deficient $TiO_{2-x}$ and the $TiO_2$ serves as a metal to insulator boundary.

In this example, the oxygen vacancies in the oxygen deficient $TiO_{2-x}$ are positively charged. Consequently, as a positive charge is applied to the first electrode (151), the vacancies are repelled away. This effectively shifts the boundary (157) towards the second electrode (152), which increases the length of the conductive, oxygen deficient $TiO_{2-x}$ portion (155) and shortens the electrically insulating $TiO_2$ portion (156). Since the length of a material affects its resistance, the boundary (157) shift effectively increases the electrical resistance of the memristance material (154). Conversely, the boundary (157) may be shifted towards the first electrode when a negative voltage is applied to the first electrode (151).

As indicated, an upward shift increases the electrical resistance of the memristance material. When the voltage is discontinued, the boundary (157) remains at the location where it is then located. Thus, the memristance material's resistance does not return to its previous magnitude prior to the application of the voltage. Instead, the memristance material maintains the resistance it had when the signal was terminated. When a signal is reapplied, the resistance may shift again starting from where it left off.

While memristance switching has been depicted with an oxygen deficiency and a moving metallic region to insulating region boundary, the switching of the memelectronic device may be achieved through other switching mechanisms.

In some examples, the first and second materials (154, 153) are just a few nanometers thick. In such examples, the boundary (157) between the first and second portions (155, 156) of the first material (154) may move just a fraction of a nanometer. However, the boundary's movement of just fraction of a nanometer may change the resistance of the memristance material by a factor of a thousand. Also, since the boundary's movement is very short, the memristance material's switching speed from one resistance level to another is very quick. In some examples, the thickness and width of the memelectronic device's materials are in the micrometer scale.

Also, in some examples, the first and second materials are less than a hundred nanometers wide. Further, in some examples, the first and second materials are less than ten nanometers wide. In some examples, the width of the first and second materials is within two to four nanometers wide.

The first material (154) may include niobium, titanium, tungsten, manganese, iron, vanadium, indium, silicon, tantalum, hafnium, nickel, aluminum, zirconium, molybdenum, copper, chromium, oxides thereof, nitrides thereof, carbides thereof, phosphides thereof, sulfides thereof, doped alloys thereof, and combinations thereof. In some examples, the first and second materials (154, 153) are different material types.

In some examples, some materials that exhibit the non-linear resistance characteristic may also be used as memristance materials when the materials are slightly altered to have a deficiency, such as the oxygen deficiency of $TiO_{2-x}$ from the above example. For example, aluminum nitride (AlN) may be used as a non-linear resistance material. However, AlN may also be used as a memristance material when a portion of the AlN is nitrogen deficient and there is a boundary between the nitrogen deficient portion and a non-nitrogen deficient portion of the AlN. In some examples, gallium nitride (GaN) may be used as either a memristance material and/or a non-linear resistance material. In some examples, $Ti_4O_7$, $Ti_2O_3$, $Ti_3O_5$, $VO_2$, $Nb_2O_5$, other transition metal oxides, or combinations thereof may be used as either a non-linear resistance material or as memristance material. The same principles may be applied to carbides, phosphides, sulfides, nitrides, oxides, and combinations thereof.

In some examples, the memristance material is doped with oxides, nitrides, carbides, sulfides, and/or phosphides in the appropriate amounts to create the desired deficiency.

The different resistive states of the memristance material may represent 1s and 0s in binary code. Thus, in memory applications writing to a memory array may include switching between a high and a low resistance state of the memristance material.

Figure 2:
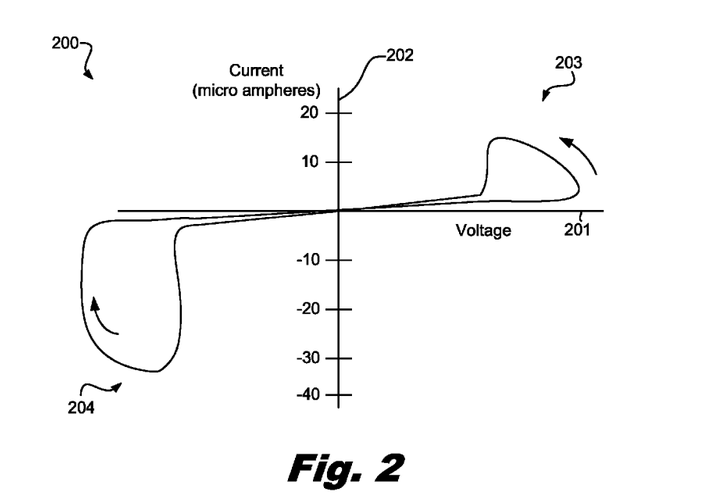
FIG. 2 is a diagram of a chart showing an illustrative switching characteristic, according to principles described herein.

FIG. 2 is a diagram of a chart (200) showing an illustrative switching characteristic of a memelectronic device, according to principles described herein. In this example, the memelectronic device has a non-linear material in series with a memristance material between a first and a second electrode. The horizontal axis (201) represents voltage, and the vertical axis (202) represents current.

As a positive voltage is applied across the memelectronic device, the device exhibits a decrease in its electrical resistance as shown in the first region (203) of the chart (200). As the voltage is decreased to a negative voltage, the current drops abruptly, and the memelectronic device exhibits an increase in its electrical resistance, which is illustrated within a second region (204) of the chart (200).

While a memristance material without a non-linear resistance material may exhibit a switching pattern, the addition of a non-linear material in series with the memristance material reduces the overall height of the switching loops. For example, the addition of the non-linear resistance material may decrease the current and/and positive voltage needed to cause the memelectronic device to exhibit metal-like characteristics and decrease the amount of current and/or negative voltage to cause the memelectronic device to exhibit insulator-like characteristics. Thus, the memelectronic device may be switched from one state to the other with less power. In other words, the addition of the non-linear resistance material reduces the overall power consumption involved with switching the memelectronic device.

In some examples, less than fifty microamperes of current are needed in either direction to switch the electrical state of the memelectronic device. In other examples, less than thirty microamperes are needed. Further, in some examples, less than ten microamperes are needed. Further, in some examples, less than one microampere is needed to switch between a metal-like and an insulator-like state of the memelectronic device.

Figure 3:
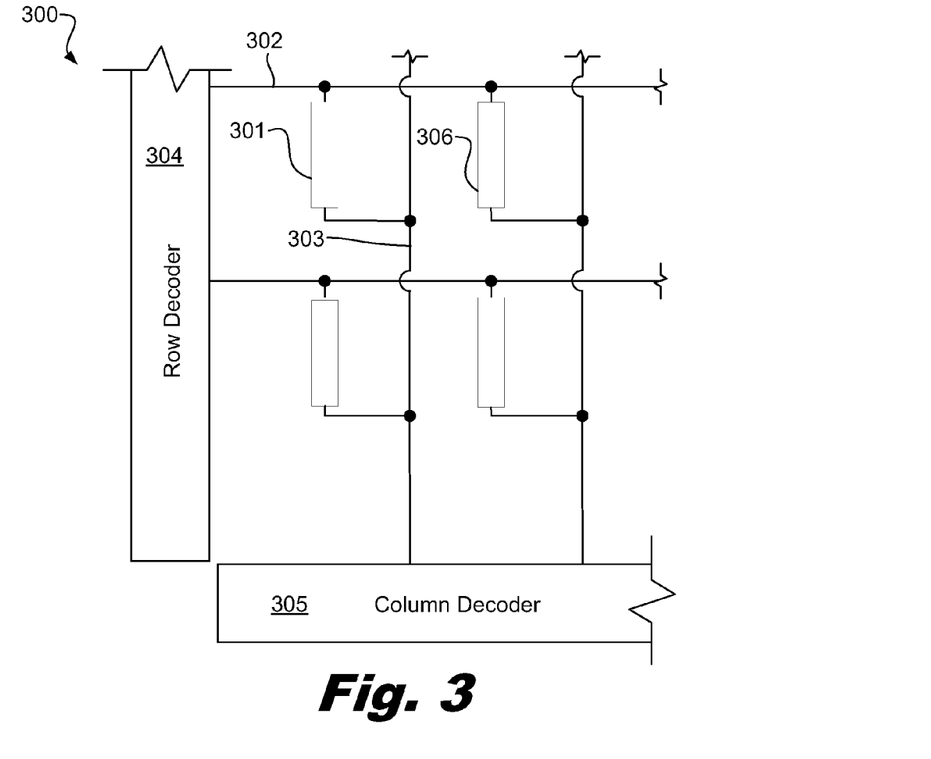
FIG. 3 is a diagram of an illustrative cross bar array, according to principles described herein.

FIG. 3 is a diagram of an illustrative cross bar array (300), according to principles described herein. In the example of FIG. 3, the cross bar array (300) has a plurality of memelectronic devices with a non-linear resistance material in series with a memristance material, such as memelectronic device (301). The memelectronic device (301) is electrically connected to a row conductor (302) and to a column conductor (303).

The row and column conductors (302, 303) are respectively electrically connected to row and column decoders (304, 305). The decoders have decoder circuitry to route signals to the desired rows and columns.

The row and column decoders (304, 305) may logically interpret input signals to collectively change the resistance of any memelectronic device in the cross bar array (300) by energizing the appropriate row and column conductors. For example, if the decoders (304, 305) receive inputs signals to change the resistance of the memelectronic device (301), the column decoder (305) may impose a column voltage on the corresponding column conductor (303), and the row decoder (304) may impose a row voltage on the corresponding row conductor (302).

The row and column voltages may be complementary voltages such that both voltages cause current to flow in the same direction at the same time, but collectively create a greater electromotive force to move the electric current. For example, the row conductor's voltage may be positive while the column conductor's voltage is negative such that both voltages drive the current through the memelectronic device.

The non-linear material of the memelectronic device (301) may exhibit a high resistance at a low electrical current or voltage level. As a consequence, when the row voltage imposes an electrical current on the row conductor (302), the non-linear resistance material may effectively restrict the voltage from affecting the memristance material of each memelectronic device (301, 306) electrically connected to row conductor (302). However, at a threshold voltage and/or threshold current, the non-linear resistance material's resistance may change to a low resistance and allow sufficient current to flow through the non-linear resistance material and influence the memristance material.

In some examples, the row conductor (302) provides half the threshold voltage and/or threshold current to change the non-linear resistance material's resistance while the column conductor (303) provides the other half. Thus, the cross bar array may modify the memelectronic device (301) without modifying the memristance material of the other memelectronic devices electrically connected to either the row conductor (302) or the column conductor (303). Thus, a non-linear resistance material in series with a memristance material may prevent cross-talk between the memelectronic devices in a cross bar array (300) as well as lower the power consumption needed to switch the resistive properties of the memristance material.

In some examples, the cross bar array (300) is a memory array and the threshold voltage and/or threshold current is a writing or reading threshold. In such examples, the row conductor may provide half of the reading or writing threshold while the column conductor provides the other half of the writing and/or reading threshold.

The addition of the non-linear resistance material in series with the memristance material lowers the power level needed to change the memristance material's resistance. Thus, less energy may be imposed on the row and column conductors, which reduces unwanted Joule heating on these conductors that can influence the memelectronic device's resistance. Since the energy is lower, the half selected memelectronic devices (those memelectronic devices electrically connected to an energized row conductor or column conductor, but not to both) will also experience less Joule heating. Since the half selected memelectronic devices are subjected to less residual effects, like unwanted Joule heating, the memelectronic devices may be moved closer together within the cross bar arrays, thereby increasing the memory density in memory applications.

Figure 4:
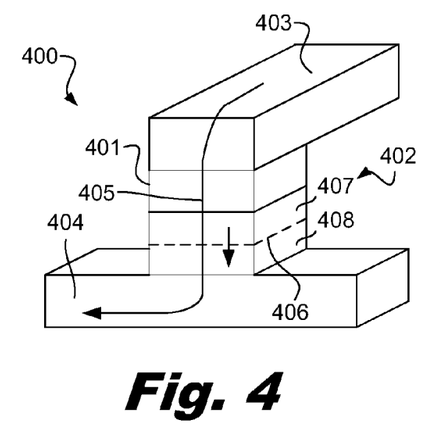
FIG. 4 is a diagram of an illustrative junction, according to principles described herein.

FIG. 4 is a diagram of an illustrative junction (400), according to principles described herein. The non-linear resistance material (401) and the memristance material (402) may be incorporated at the junctions between first and second conductors (403, 404). As a signal is imposed on the junction (400) that meets the non-linear resistance material's threshold, current flows through the junction from the first conductor (403) to the second conductor (404) in a first direction (405). As the current flows in the first direction (405), the boundary (406) between the conductive portion (407) and the resistive portion (408) of the memristance material (402) also moves in the first direction (405). The movement of the boundary (406) may change the resistance properties of the memristance material by a sufficient factor.

Figure 5:
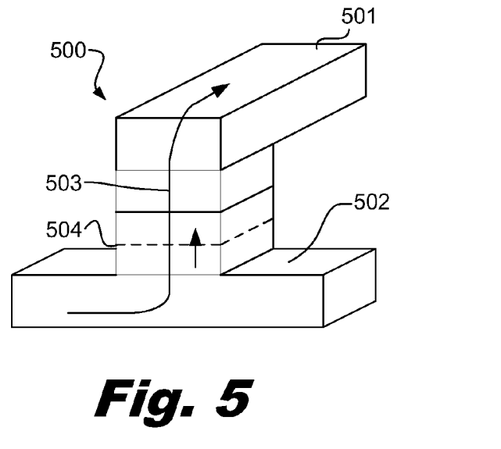
FIG. 5 is a diagram of an illustrative junction, according to principles described herein.

FIG. 5 is a diagram of an illustrative junction (500), according to principles described herein. In this illustrated example, another electrical signal is imposed on the junction (500) that also meets the non-linear resistance material's threshold, but causes electrical current to flow through the junction (500) from the second conductor (502) to the first conductor (501) in a second direction (503). Here, the boundary (504) also moves in the second direction (503) to change the memristance material's resistance. While the boundaries in FIGS. 4 and 5 are depicted as moving with the flow of current, in some examples, the boundary moves against the flow of current.

Figure 6:
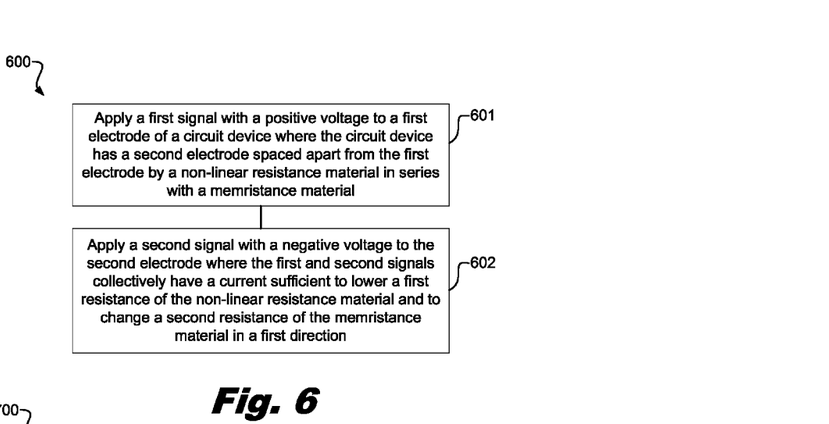
FIG. 6 is a diagram of an illustrative method for controlling a circuit device, according to principles described herein.

FIG. 6 is a diagram of an illustrative method (600) for controlling a circuit device, according to principles described herein. In this example, the method (600) includes applying (601) a first signal with a positive voltage to a first electrode of a circuit device where the circuit device has a second electrode spaced apart from the first electrode by a non-linear resistance material in series with a memristance material. The method (600) also includes applying (602) a second signal with a negative voltage to the second electrode where the first and second signals collectively have a current sufficient to lower a first resistance of the non-linear resistance material and to change a second resistance of the memristance material in a first direction.

In some examples, a high resistance phase of the non-linear resistance material has a characteristic of blocking the first signal on the first conductor from substantially stimulating the memristance material with the second signal. In some examples, substantially stimulating the memristance material includes moving the boundary of the memristance material's conductive and resistive portions a fraction of a nanometer. In some examples, the first and the second signals have less than fifty microamperes of current.

Figure 7:
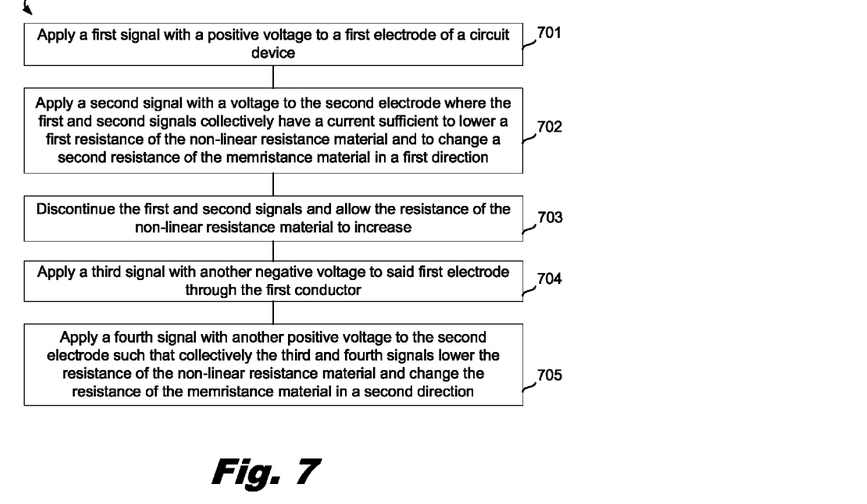
FIG. 7 is a diagram of an illustrative method for controlling a circuit device, according to principles described herein.

FIG. 7 is a diagram of an illustrative method (700) for controlling a circuit device, according to principles described herein. In this example, the method (700) also includes applying (701) a first signal with a positive voltage to a first electrode of a circuit device and applying (702) a second signal with a negative voltage to the second electrode such that the first and second signals collectively have a current sufficient to lower a first resistance of the non-linear resistance material and to change a second resistance of the memristance material in a first direction. The method (700) further includes discontinuing (703) the first and second signal and allowing the first resistance of the non-linear resistance material to increase. Next, the method (700) includes applying (704) a third signal with a negative voltage to the first electrode and applying (705) a fourth signal with a positive voltage to a second electrode such that collectively the third and fourth signals lower the first resistance of the non-linear resistance material and change the second resistance of the memristance material in a second direction.

Figure 8:
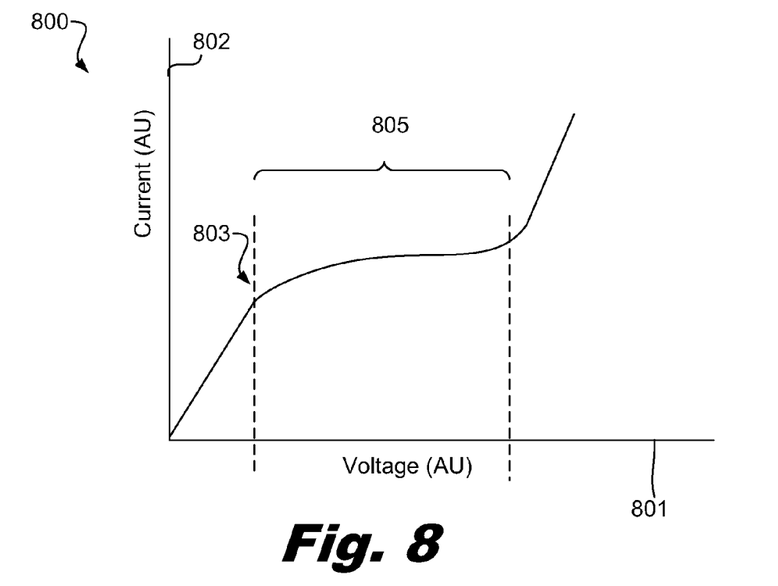
FIG. 8 is a diagram of a chart showing an illustrative non-linear resistance characteristic, according to principles described herein.

FIG. 8 is a diagram (800) showing an illustrative non-linear resistance characteristic of a non-linear resistance material, according to principles described herein. In this example, the non-linear resistance characteristic is depicted without being connected in series to the memristance material for purposes of illustration. In this chart (800), the horizontal axis (801) schematically represents voltage and the vertical axis (802) schematically represents current.

In this example, below an effective threshold voltage (803), the relationship between the voltage and current is linear. However, at the voltage threshold (803), the current increases disproportionately with respect to the voltage. In this region (804), the overall resistance of the non-linear material is significantly decreased. In examples where the non-linear resistance material is in series with a memristance material, when a voltage is applied within the low resistance region, the non-linear resistance material allows for an increased amount of current to flow through it. As a consequence, an increased amount of current reaches the memristance material allowing the memristance material's resistance to change.

In some examples, the threshold voltage (803) and the low resistance region (804) occur at low current and/or voltage levels. As a consequence, the memristance material's resistance may be changed with low power.

Figure 9:
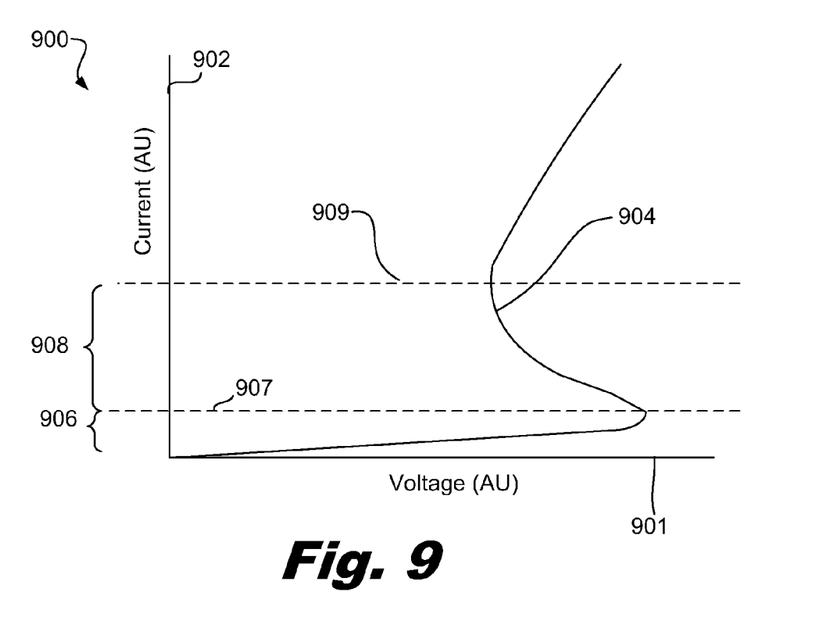
FIG. 9 is a diagram of a chart showing an illustrative non-linear resistance characteristic, according to principles described herein.

FIG. 9 is a diagram (900) showing an illustrative non-linear resistance characteristic of a non-linear resistance material, according to principles described herein. In this example, the non-linear resistance characteristic is depicted without being connected in series to the memristance material for purposes of illustration. The x-axis (901) schematically represents voltage in arbitrary units, and the y-axis (902) schematically represents current in arbitrary units. In this example, the current-voltage characteristics (904) of the non-linear voltage material include a low current range (906) where the resistance is positive. However, when the current reaches a threshold value (907), the voltage drops within a negative differential resistance (NDR) range (908). As the current increases, the current reaches another value (909), where the differential resistance is positive again.

Within the NDR region (908) of the example of FIG. 9, the non-linear resistance material may be undergoing a metal-to-insulator phase transition, but may exhibit either a metal or insulator phase. Within this NDR region (908), the material can exhibit either a metal or insulator phase. The MIT material may abruptly transition from one phase to the other phase by adjusting the current to be outside the NDR regions. However, both the metal or insulator phase may be stable within the NDR region, and either phase may be held within the NDR range. For example, an MIT material may need an initial, high amount of current outside of the NDR range (908) to cause the MIT material to transition to a metal phase abruptly. Once the phase transition occurs, the current level may be dropped below the transition current (909) to maintain the MIT materials phase.

In some examples, when an NDR, non-linear material is in series with the memristance material, a signal or signals that reach the current threshold (908) may switch the non-linear material from an insulator phase to a metal phase, thereby allowing current to pass through the non-linear resistance material and reach the memristance material. In some examples, the non-linear resistance characteristic is an S-NDR characteristic, an N-NDR characteristic, an exponential characteristic, another non-linear characteristic, or combinations thereof.

Figure 10:
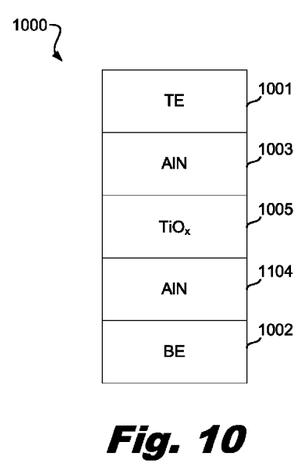
FIG. 10 is a diagram of an illustrative memelectronic device, according to principles described herein.

FIG. 10 is a diagram of an illustrative memelectronic device (1000), according to principles described herein. In this example, the memelectronic device (1000) has a first electrode (1001), a second electrode (1002), a first and a second non-linear resistance material (1003, 1004) made of aluminum nitride, and a memristance material (1005) made of a titanium oxide. In this example, the first and the second non-linear resistance materials collectively provide the non-linear resistance characteristic.

Figure 11:
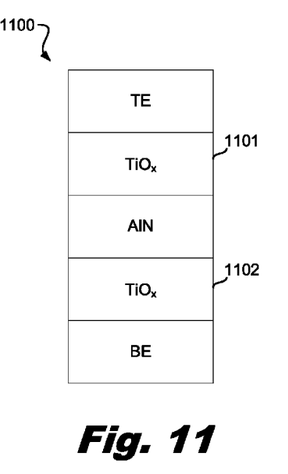
FIG. 11 is a diagram of an illustrative memelectronic device, according to principles described herein.

FIG. 11 is a diagram of an illustrative memelectronic device (1100), according to principles described herein. In this example, the memelectronic device (1100) includes a first and a second memristance material (1101, 1102). The boundaries between the metallic and insulating regions of the first and second memristance materials (1101, 1102) may be such that they move in the same direction. In other examples, the boundaries move in opposite directions.

Figure 12:
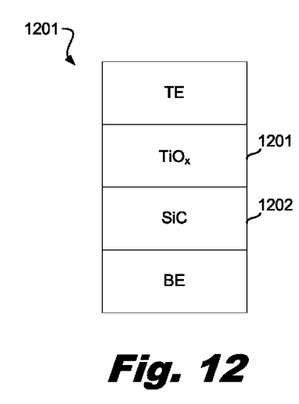
FIG. 12 is a diagram of an illustrative memelectronic device, according to principles described herein.

FIG. 12 is a diagram of an illustrative memelectronic device (1200), according to principles described herein. In this example, the memelectronic device includes a non-linear resistance material (1201) of titanium oxide and a memristance material (1202) of silicon carbide. In this example, the memristance material has an electron deficiency or a carbon deficiency to provide the memristance characteristics.

Figure 13:
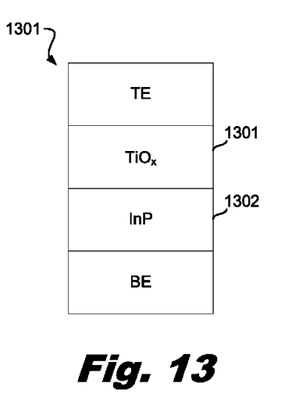
FIG. 13 is a diagram of an illustrative memelectronic device, according to principles described herein.

FIG. 13 is a diagram of an illustrative memelectronic device (1300), according to principles described herein. In this example, the memelectronic device includes a non-linear resistance material (1301) of titanium oxide and a memristance material (1302) of indium phosphide. In this example, the memristance material has an electron deficiency or a phosphorous deficiency to provide the memristance characteristics.

While the memelectronic device has been depicted as a two terminal device and incorporated in a cross bar memory array, the memelectronic device may be used in other applications. For examples, a non-exhaustive list of applications for a memelectronic device according to the principles described herein includes logic gates, memory devices, matrixes, synapse, cross bar latches, active matrixes, passive matrixes, cross bar arrays, stacked cross bar arrays, decoder circuits, other applications, or combinations thereof.

The memelectronic devices according to the principles herein may be built upon with complementary metal-oxide-semiconductor (CMOS) technology. In some examples, the materials of the memelectronic device are deposited on a silicon substrates, flexible substrates, or combinations thereof. In some examples, the memelectronic device's materials are deposited with atomic layer diffusion, nano-imprint lithography, sputter deposition, or combinations thereof.

While in the preceding description some auxiliary materials and memristance materials have been depicted in certain combinations, any combination of materials yielding the collective effects of the auxiliary and memristance characteristics may be used. A non-exhaustive list of combinations may include a transition metal oxide memristance material with a nitride non-linear resistance material, a nitride memristance material with a transition metal oxide non-linear resistance material, a carbide memristance material with a transition metal oxide non-linear resistance material, a sulfide memristance material with a transition metal oxide non-linear resistance material, a phosphide memristance material with a transition metal oxide non-linear resistance material, other combinations, and combinations thereof.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A memelectronic device, comprising:
   a first electrode and a second electrode spaced apart by a plurality of materials;
   a first material of said plurality comprises a memory characteristic wherein said first material maintains a magnitude of an electrically controlled physical property after an electrical stimulus on said first material has been discontinued; and
   a second material of said plurality, which is different and separate from said first material comprising said memory characteristic, wherein said second material comprises an auxiliary characteristic that affects an electrical property of said memelectronic device.

2. The device of claim 1, wherein said first material comprises niobium, titanium, tungsten, manganese, iron, vanadium, indium, silicon, tantalum, hafnium, nickel, aluminum, zirconium, molybdenum, copper, chromium, oxides thereof, nitrides thereof, carbides thereof, phosphides thereof, sulfides thereof, doped alloys thereof, and combinations thereof.

3. The device of claim 1, wherein said second material comprises niobium, titanium, tungsten, manganese, iron, vanadium, indium, silicon, tantalum, hafnium, nickel, aluminum, zirconium, molybdenum, copper, chromium, oxides thereof, nitrides thereof, carbides thereof, phosphides thereof, sulfides thereof, doped alloys thereof, and combinations thereof.

4. The device of claim 1, wherein said memory characteristic is memristance, memcapacitance, meminductance, memimpedance, memaddmittance, or combinations thereof.

5. The device of claim 1, wherein said electrical stimulus comprises flowing current through said first material.

6. The device of claim 1, wherein said auxiliary characteristic is a non-linear resistance characteristic, a current limiting characteristic, a thermal characteristic, a negative differential resistance characteristic, or combinations thereof.

7. The device of claim 1, wherein said plurality of materials comprises a third material between said first and second electrodes, said third material comprising a second memory characteristic and/or a second auxiliary characteristic.

8. The device of claim 1, wherein said auxiliary characteristic is a non-linear resistance characteristic.

9. The device of claim 1, wherein said auxiliary characteristic is a current limiting characteristic.

10. The device of claim 1, wherein said auxiliary characteristic is a thermal characteristic.

11. The device of claim 1, wherein said auxiliary characteristic is a negative differential characteristic.

12. The device of claim 1, wherein said memory characteristics is memcapacitance.

13. The device of claim 1, wherein said memory characteristic is meminductance.

14. A system, comprising
    a first electrical conductor connected to a second electrical conductors at a junction;
    said first electrical conductor being spaced apart from said second electrical conductor by a plurality of materials of said junction;
    a first material of said plurality of materials comprises a memristance characteristic; and
    a second material of said plurality of materials comprises a non-linear resistance characteristic;
    wherein said plurality of materials comprises a third material that comprises a second memristance characteristic and/or a second non-linear resistance characteristic.

15. The system of claim 14, wherein said first and second electrical conductors are part of a memory array.

16. A method for controlling a memelectronic device, the device comprising:
    a first electrode and a second electrode spaced apart by a plurality of materials;
    a first material of said plurality comprises a memory characteristic wherein said first material maintains a magnitude of an electrically controlled physical property after an electrical stimulus on said first material has been discontinued; and
    a second material of said plurality comprises an auxiliary characteristic that affects an electrical property of said memelectronic device;
    the method, comprising:
    applying a first signal with a positive voltage to said first electrode, said second electrode spaced apart from said first electrode by said plurality of materials comprising a non-linear resistance material in series with a memristance material; and
    applying a second signal with a negative voltage to said second electrode; said first and second signals collectively comprising a current sufficient to lower a first resistance of said non-linear resistance material and to change a second resistance of said memristance material in a first direction.

17. The method of claim 16, wherein a high resistance phase of said non-linear resistance material comprises a characteristic of blocking said first signal from substantially influencing said memristance material without said second signal.

18. The method of claim 16, further comprising discontinuing said first and second signals and allowing said first resistance of said non-linear resistance material to increase.

19. The method of claim 18, further comprising:
    applying a third signal with a negative voltage to said first electrode; and
    applying a fourth signal with a positive voltage to said second electrode such that collectively said third and fourth signals lower said first resistance of said nonlinear resistance material and change said second resistance of said memristance material in a second direction.

20. The method of claim 16, wherein said first and second signals each comprise a current less than fifty micro amperes.

* * * * *

UNITED STATES PATENT AND TRADEMARK OFFICE
CERTIFICATE OF CORRECTION

| | | |
|---|---|---|
| PATENT NO. | : 8,767,438 B2 | Page 1 of 1 |
| APPLICATION NO. | : 13/424034 | |
| DATED | : July 1, 2014 | |
| INVENTOR(S) | : Jianhua Yang et al. | |

It is certified that error appears in the above-identified patent and that said Letters Patent is hereby corrected as shown below:

In the Claims:

In column 9, line 61, in Claim 4, delete "memimpediance, memaddmittance," and insert -- memimpedance, memadmittance, --, therefor.

Signed and Sealed this
Eighteenth Day of November, 2014

Michelle K. Lee
*Deputy Director of the United States Patent and Trademark Office*